United States Patent [19]
Bottman

[11] Patent Number: 5,633,801
[45] Date of Patent: May 27, 1997

[54] PULSE-BASED IMPEDANCE MEASUREMENT INSTRUMENT

[75] Inventor: Jeffrey S. Bottman, Seattle, Wash.

[73] Assignee: Fluke Corporation, Everett, Wash.

[21] Appl. No.: 540,927

[22] Filed: Oct. 11, 1995

[51] Int. Cl.$^6$ .................................................... G01R 27/16
[52] U.S. Cl. ............... 364/482; 364/571.01; 364/571.04; 324/600
[58] Field of Search ...................... 364/481–482, 364/484, 486, 571.01, 571.02, 571.04; 324/512, 519–522, 525, 527, 600, 601, 612, 615–617, 638–639, 641, 649, 650, 654, 658

[56] References Cited

U.S. PATENT DOCUMENTS

| | | | |
|---|---|---|---|
| 4,977,376 | 12/1990 | Schiek et al. | 324/613 |
| 5,063,351 | 11/1991 | Goldthorp et al. | 324/628 |
| 5,128,619 | 7/1992 | Bjork et al. | 324/533 |
| 5,185,735 | 2/1993 | Ernst | 370/13 |
| 5,243,294 | 9/1993 | Burnett | 324/535 |
| 5,291,140 | 3/1994 | Wagner | 324/615 |
| 5,321,632 | 6/1994 | Otsuji et al. | 364/562 |
| 5,345,182 | 9/1994 | Wakamatsu | 324/649 |
| 5,363,049 | 11/1994 | Bullock et al. | 324/520 |
| 5,371,468 | 12/1994 | Pelster | 324/638 |
| 5,454,377 | 10/1995 | Dzwonczyk et al. | 128/734 |

OTHER PUBLICATIONS

"High Resolution Frequency–Domain Reflectometry", Hugo Vanhamme, IEEE Trans Instrumentation & Measurement, vol. 39. No. 2, pp. 369–375 Apr. 1990.

"Short–Pulse Propagation Technique for Characterizing Resistive Package Interconnections", Deutsch et al., IEEE Electronic Components, 42nd Annual Conference, pp. 736–739 1992.

"RF Impedance Measurements by Voltage–Current Detection", Ichiro Yokoshima, IEEE Trans. Instrumentation & Measurement, vol. 42, No. 2, pp. 524–527 Apr. 1993.

*Primary Examiner*—Ellis B. Ramirez
*Assistant Examiner*—Tuan Q. Dam
*Attorney, Agent, or Firm*—Douglas J. Barker

[57] ABSTRACT

In accordance with the present invention, a pulse-based impedance measurement instrument is provided. A pulse generator repetitively generates a stimulus pulse to a device under test (DUT). A digitizer circuit, consisting of a sample-and-hold circuit, an analog to digital converter, and acquisition memory, repetitively samples the response voltage across the DUT to create a time record of the voltage as a function of time during a pulse response measurement. Each time record is operated on by a Fast Fourier Transform (FFT) which converts the voltage versus time information into voltage versus frequency information in a manner well known in the art. By measuring a set of calibration resistors with known resistance values to generate a set of complex calibration constants, the impedance measurement instrument provides measurements of complex impedance and return loss versus frequency of a DUT.

8 Claims, 7 Drawing Sheets

IMPEDANCE MEASUREMENT INSTRUMENT

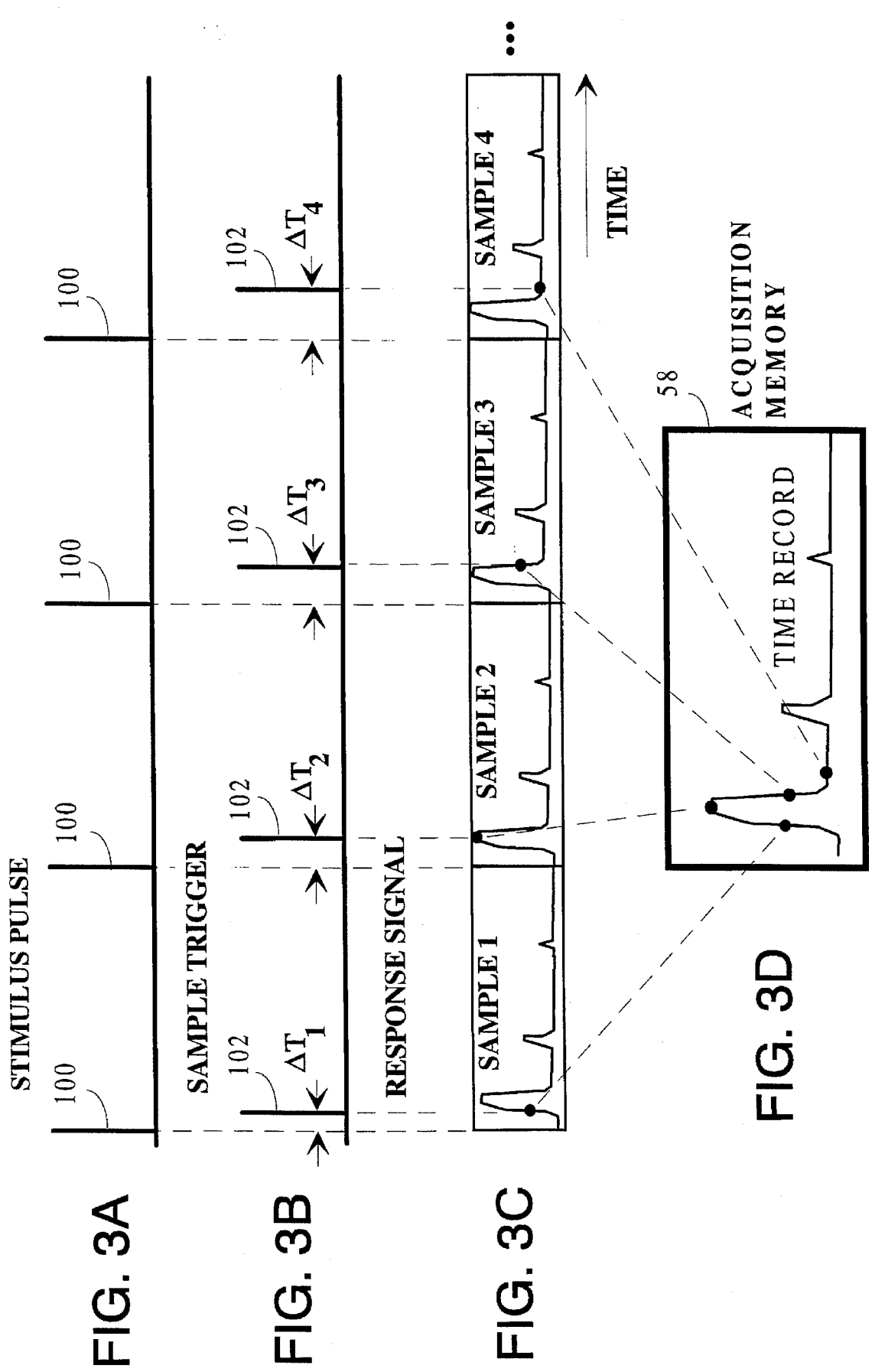

PULSE-BASED IMPEDANCE MEASUREMENT INSTRUMENT

BACKGROUND OF THE INVENTION

This invention relates generally to electrical impedance measurement instruments and in particular to impedance measurement instruments employing pulses to measure complex impedances.

A variety of electronic instruments exist for measuring electrical impedance between a pair of terminals of a one-port device under test (DUT). Impedance, expressed in units of ohms, defines the relationship of the electrical current I through the DUT to the voltage V across the DUT. In the simplest case, impedance may be purely resistive such that the voltage and current in the DUT are in phase. The relationship is governed by Ohm's law such that $R=V/I$ where R is the resistance. Impedance may also be complex when there is a significant amount of reactance in the DUT from capacitive or inductive elements. Complex impedance is thus composed of the resistive element R and a reactive element X which causes the current through the DUT to lead or lag the voltage. Complex impedance Z is often expressed as the equation $Z=R+jX$. Complex impedances typically vary as a function of frequency and therefore the user must specify the frequency range of interest to obtain a meaningful complex impedance value. Thus, the impedance equation becomes $Z(f)=R(f)+jX(f)$ where f is the frequency of interest.

Electronic measuring instruments capable of determining the complex impedance of one-port devices include vector network analyzers and electronic component analyzers. Vector network analyzers and component analyzers are closely related and operate in a similar manner, differing mainly in how the measured complex impedance information is processed and displayed. Vector network analyzers display complex impedance graphically, typically in the form of impedance versus frequency. Component analyzers, in addition to graphically displaying the impedance information, often use the impedance information to mathematically model electronic component parameters, such as the parasitic capacitance that occurs across a resistor, which is modeled as a shunt R-C circuit. Newer instrument designs now further blur the distinction between vector network analyzers and component analyzers by incorporating more features traditionally found in only one or the other type of instrument.

Both vector network analyzers and component analyzers impose an incident signal across the two terminals of the DUT in the form of a continuous wave (CW) signal at high frequencies. Because these analyzers employ linear receivers to receive the reflected signal over a selected range of frequencies, the incident signal is usually in the form of a swept-frequency sine wave with a high amount of spectral purity. The instrument then determines the reaction of the DUT to the incident signal by measuring the resulting reflected signal from the DUT and comparing it to the reflected signal from a reference resistor with a known impedance to arrive at a return loss measurement, which is in terms of both magnitude and phase. From the return loss measurement, the impedance between the two terminals of the DUT may be calculated. Because vector network analyzers and component analyzers typically provide swept-frequency sine wave measurements, a return loss versus frequency or impedance versus frequency graph may be obtained by specifying the frequency range of interest.

While capable of providing superior accuracy in measuring impedance and return loss, vector network analyzers tend to be expensive, complex, and bulky. Vector network analyzers are therefore limited to laboratory and bench-top applications rather than field service applications. Furthermore, only a very sophisticated subset of available vector network analyzers provide an ability to extract distance information using mathematical transforms. The typical network analyzer provides only a limited ability to troubleshoot and locate the possible causes of an impedance or return loss measurement along a transmission line DUT that fails a performance specification limit.

Pulse-based measurements of impedance may be performed by a time delay reflectometer (TDR) in a manner well known in the art. The TDR performs an impedance measurement by introducing an incident pulse of known magnitude into the DUT and measuring the resulting reflected signal. Because the incident pulse width can be made very narrow, typically less than ten nanoseconds, the TDR can measure impedance as a function of time along the transmission line with high resolution. TDR's thus have the ability to troubleshoot transmission lines by detecting discontinuities that can disrupt signals and are most often applied in measuring the impedance along transmission lines which include coaxial cables and twisted-pairs. Measuring impedance at selected points along the transmission line has the advantage of allowing faults or discontinuities along the transmission line to be detected and localized, a feature particularly desirable for field service applications. If the propagation velocity of the signals through the transmission line are known, the time delay between incident and reflected pulses may be used to determine the distance to the fault from the instrument along the transmission line. Simple, inexpensive, and portable TDR's for field service applications are commercially available to perform such measurements.

In performing an impedance measurement with a TDR, the magnitude of the reflected pulse as a fraction of the incident pulse may be used to calculate the characteristic impedance at any given point along the transmission line as referenced to the output impedance of the TDR. In most cases, a TDR measurement is adequate to provide a characteristic impedance of a transmission line and to locate discontinuities along the transmission line. However, TDR measurements provide only magnitude versus time information using analog techniques. As a pulse is launched, an analog trace is swept along a horizontal display, deflected vertically by the voltage level of the reflected signal. Such traditional TDR techniques do not measure impedance versus frequency of the DUT, but rather display only its pulse response. Therefore, it would be desirable to provide a low cost, portable, pulse-based impedance measurement instrument that measures complex impedance and return loss.

SUMMARY OF THE INVENTION

In accordance with the present invention, a pulse-based impedance measurement instrument is provided. A pulse generator with a source resistance Rs and a peak voltage Vs is coupled to a pair of test terminals. A digitizer circuit, consisting of a sample-and-hold circuit, an analog to digital converter, and acquisition memory, creates a time record of the voltage Vo present across the test terminals during a pulse response measurement. The time record is created by repetitively generating stimulus pulses and sampling the voltage Vo of the response signal to obtain a time record with high time resolution. A time record is an array of digital measurement values stored in memory locations corresponding with the time along the original response signal. The time record thus becomes the digitally sampled equivalent of the response signal which may be used to reproduce the response signal or be converted into its frequency domain representation by a Fast Fourier Transform (FFT). The FFT, performed by a microprocessor, converts the voltage versus time information into voltage versus frequency information, the frequency domain representation, in a manner well known in the art. The frequency domain representation is maintained as a set of complex values, with real and imaginary components, to preserve the phase component of the response signal necessary to calculate complex impedance. By measuring a set of calibration resistors with known resistance values to generate a set of complex calibration constants, the impedance measurement instrument can thus provide measurements of complex impedance versus frequency.

The impedance measurement instrument is calibrated by coupling each member of a set of calibration resistors with known resistance values across the instrument connector and converting the pulse response of each calibration resistor into complex frequency domain information using a fast Fourier transform (FFT) algorithm. The set of calibration measurements now as a frequency domain representation according to the various calibration resistors represents a set of voltage values versus frequency which are used to solve for the complex calibration constants for each frequency. Thus, an entire series of linear equations, one set for each frequency, must be solved in order to obtain the complex calibration constants versus frequency. The stored calibration constants for each frequency are stored for long periods of time spanning months in the form of data arrays of complex calibration values indexed according to frequency and are updated only when the measurement instrument is re-calibrated.

The DUT is coupled to the instrument connector, a measurement is taken, and an FFT performed, resulting in a frequency record of response voltage versus frequency, expressed as Vo(f) where Vo(f) is a complex array of voltage values indexed according to frequency. For each frequency f, the impedance of the DUT expressed as Z(f) is calculated from Vo(f) and the associated complex calibration constants.

One object of the present invention is to provide a low-cost, portable impedance measurement instrument.

Another object of the present invention is to provide a pulse-based impedance measurement instrument that measures complex impedances over a selected range of frequencies.

An additional object of the present invention is to provide a method of obtaining pulse-based complex impedance measurements as a function of frequency using fast Fourier transforms.

Other features, attainments, and advantages will become apparent to those skilled in the art upon a reading of the following description when taken in conjunction with the accompanying drawings.

BRIEF DESCRIPTION OF THE DRAWINGS

FIGS. 3A–D are graphs illustrating the process of repetitive digital sampling to obtain a digital time record with high time resolution in the impedance measurement instrument;

DETAILED DESCRIPTION OF THE INVENTION

Figure 1:
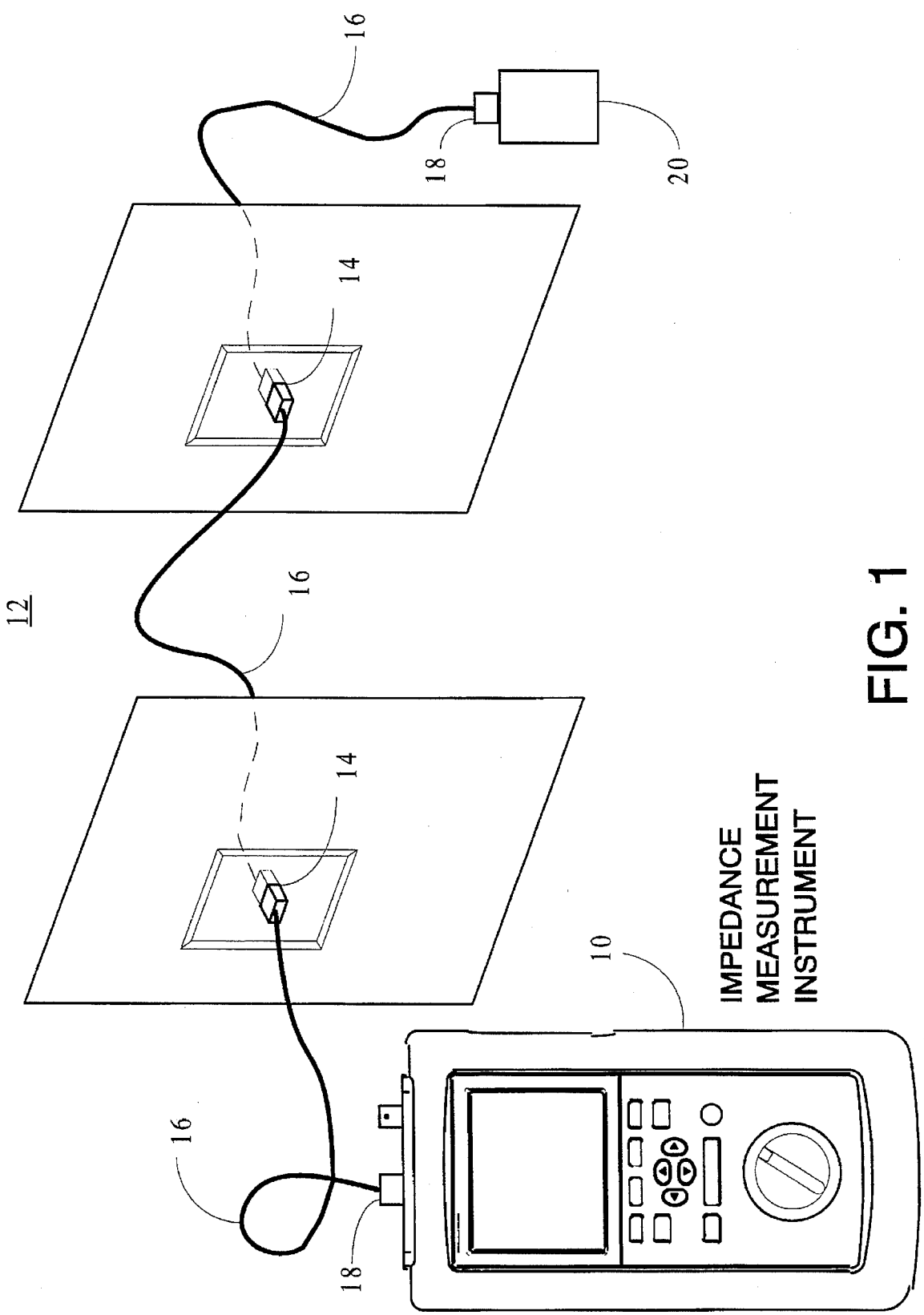
FIG. 1 is an illustration of an impedance measurement instrument measuring a transmission line according to the present invention.

FIG. 1 is an illustration of an impedance measurement instrument 10 according to the present invention measuring the complex impedance of a device under test (DUT) in the form of a transmission line 12. The transmission line 12 as shown may be comprised of any number of cable segments 16 of various lengths coupled together by connectors 14 as shown and with a set of connectors 18 at opposite ends. The transmission line 12 is coupled to the instrument 10 via one of the connectors 18. Coupled to the other connector 18 is a termination resistor 20 which provides a resistive termination to the transmission line 12. The resistance of the termination resistor 20 is selected to substantially match the specified characteristic impedance of the transmission line 12 to minimize reflected pulses according to accepted engineering practice. In the preferred embodiment, the transmission line 12 has a characteristic impedance of approximately 100 ohms and the termination 20 is a 100 ohm resistor.

In servicing and maintaining various types of transmission lines, in particular, local area networks (LAN's) used for data communication, it is desirable that the complex impedance and return loss of the transmission line 12 be measured. Return loss, which is derived from complex impedance, is an emerging field test requirement in many regions of the world for certification of LAN cable systems. Alternatively, the DUT coupled to the instrument 10 may take the form of any generic one-port electrical network, such as a passive resistor, capacitor, or inductor network, in which it is desired that a complex impedance be measured.

Figure 2:
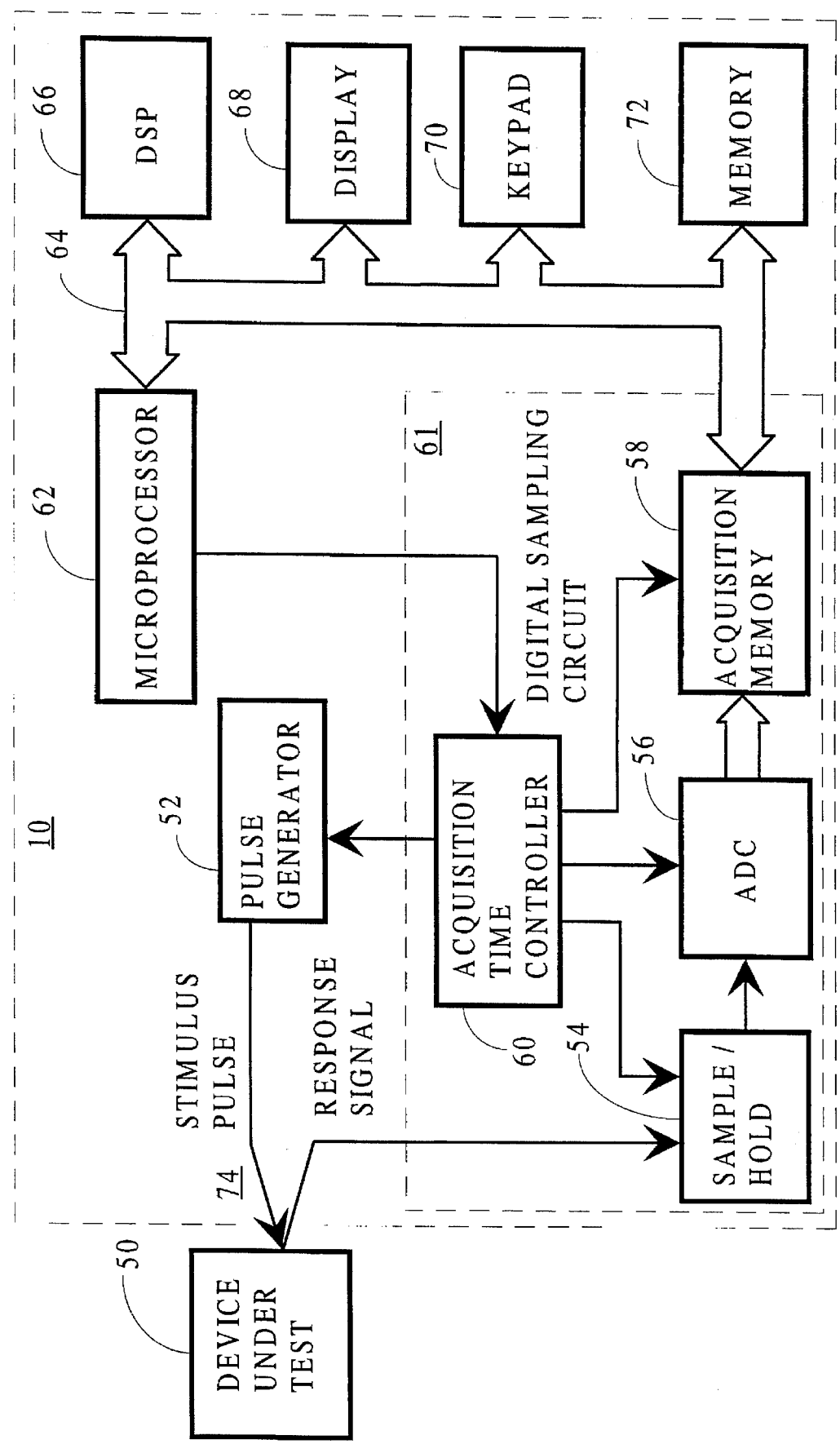
FIG. 2 is a simplified block diagram of the impedance measurement instrument of FIG. 1.

FIG. 2 is a simplified block diagram of the impedance measurement instrument 10 according to the present invention. The impedance measurement instrument 10 is shown coupled to a one-port DUT 50. In measuring a one-port device, the stimulus and response signals are coupled to the same port. The DUT 50 corresponds with the transmission line 12 and termination 20 as shown in FIG. 1 in the preferred embodiment. A pulse generator 52 generates stimulus pulses which are coupled to the DUT 50 responsive to a pulse trigger. The response signal from the DUT 50 is coupled to an input of a sample and hold circuit (S/H) which captures voltage levels responsive to a sample trigger signal received at a sampling input to generate discrete voltage samples. The discrete voltage samples are coupled to an analog to digital converter (ADC) 56 which converts the samples to digital measurement values responsive to an ADC trigger signal received at a trigger input. The digital measurement values are coupled to an acquisition memory 58 which stores the digital measurement values at locations corresponding to selected time values responsive to a memory trigger signal. An acquisition time controller (ATC) 60 generates the pulse trigger signal, sample trigger signal, ADC trigger signal, and memory trigger signal to coordinate the process of repetitively sampling the response signal in order to assemble the time record of the response signal in the acquisition memory 58.

The S/H 54, ADC 56, acquisition memory 58, and ATC 60 together comprise a digital sampling circuit 61. In the present invention, the equivalent sampling rate of 500 megasamples per second was chosen in order to provide complex impedance measurements up to 100 megahertz with sufficient amplitude and time accuracy. Other circuits capable of digitally sampling an analog signal are commercially available and may be substituted where the equivalent sampling rate and measurement accuracy are adequate to support the intended application.

The time record is an array of digital measurement values stored in memory locations in the acquisition memory 58 corresponding with the selected time delay from the incident pulse along the original response signal. The time record thus becomes the digitally sampled equivalent of the response signal which may be used to reproduce the response signal or be converted into its frequency domain representation by a Fast Fourier Transform (FFT). After a pulse response measurement is complete, the acquisition memory 58 now contains a completed digital time record of the response signal. The repetitive sampling process according to the present invention is explained in more detail below.

A microprocessor 62 may consist of any of a variety of commercially available microprocessors which are programmed to perform general instrument operating and control functions. The microprocessor 62 is coupled to a variety of instrument components via a digital data bus 64 including a digital signal processor (DSP) 66, a display 68, a keypad 70, a memory 72, and the acquisition memory 58 to coordinate the instrument measurement, calculation, control, and display functions. The microprocessor 62 is further coupled to the ATC 60 to control the overall pulse response measurement process. The digital time records may be moved into the memory 72 from the acquisition memory 58 for further mathematical operations and display.

The keypad 70 and display 68 comprise the instrument user interface. The keypad 68 may include keys, rotary knobs, switches or other commercially available input devices for control of digital devices. In the preferred embodiment, display 70 is a dot-matrix liquid crystal display (LCD) which is capable of displaying text and graphics. The memory 72 is commercially available random access memory (RAM) of sufficient memory capacity to store digital time records, calibration data, and other information necessary to the measurement process.

The DSP 66, while not necessary to practice the present invention, is a commercially available microprocessor optimized to perform fast Fourier transforms (FFT's) in a manner substantially faster than a general purpose microprocessor such as that chosen for microprocessor 62. The DSP 66 is used extensively in the present invention to convert digital time records to their frequency domain equivalents and is included in the preferred embodiment to substantially increase overall measurement speed and throughput of the measurement instrument 10.

The measurement instrument 10 is coupled to the DUT 50 via an instrument connector 74. Because the DUT 50 is often in the form of a transmission line 12 such as a twisted-pair cable, the instrument connector 74 must incorporate a means to convert the single unbalanced line which is referenced to instrument ground to a balanced line output to drive the balanced line of a twisted pair cable in a differential manner. An unbalanced-to-balanced transformer, commonly referred to as a balun (not shown), is employed in the preferred embodiment to accomplish this task.

FIGS. 3A–D are graphs illustrating the process of repetitive digital sampling to obtain a digital time record of the pulse response with high time resolution. Repetitive digital sampling is employed in the present invention to obtain higher time resolution of the sampled pulse response measurements than possible with real time sampling techniques. The stimulus is repetitively generated and induced into the DUT 52 which returns a response signal which is substantially identically over each repetition. A voltage sample of each repetition of the response signal is sampled at a desired time delay from the stimulus pulse. Over multiple measurements and multiple time delays, a sampled representation of the input signal is assembled in the acquisition memory 58 in memory locations corresponding to each desired delay time to form a time record. Because the time delays may be selected with a high amount of time resolution, relatively high equivalent time sampling rates are possible. In the preferred embodiment, the time resolution of the sampled pulse response is two nanoseconds which is obtained using an ADC 56 which has a real time sample rate of four megahertz.

In FIG. 3A, a series of stimulus pulses 100 are generated by the pulse generator 52 (shown FIG. 2). For purposes of illustration, one sample trigger 102 is generated per stimulus pulse 100. The preferred embodiment of the present invention employs 16 sample triggers 102 per stimulus pulse 100. Greater or fewer sample triggers 102 may be selected depending on the desired repetition rate and available sample rate of the ADC 56. In FIG. 3B, the sample trigger 102, shown at delay times $\Delta T1$–$\Delta T4$, determines when the S/H 54 samples the response signal relative to the stimulus pulse. In FIG. 3C, the same response signal is received for each stimulus pulse. As shown, a total of four samples labeled SAMPLE 1–4 from four repetitions of response signal are taken but at different delay times $\Delta T1$–$\Delta T4$. In FIG. 3D, as each measurement value is collected according to the desired delay time, the measurement value is then placed in the acquisition memory 58 according to the delay time. The order in which the time delays are selected may be sequential, for example, left to right across the acquisition memory 58, or random. Random and sequential digital sampling techniques are known in the art and either can be employed to implement the present invention.

Figure 4A:
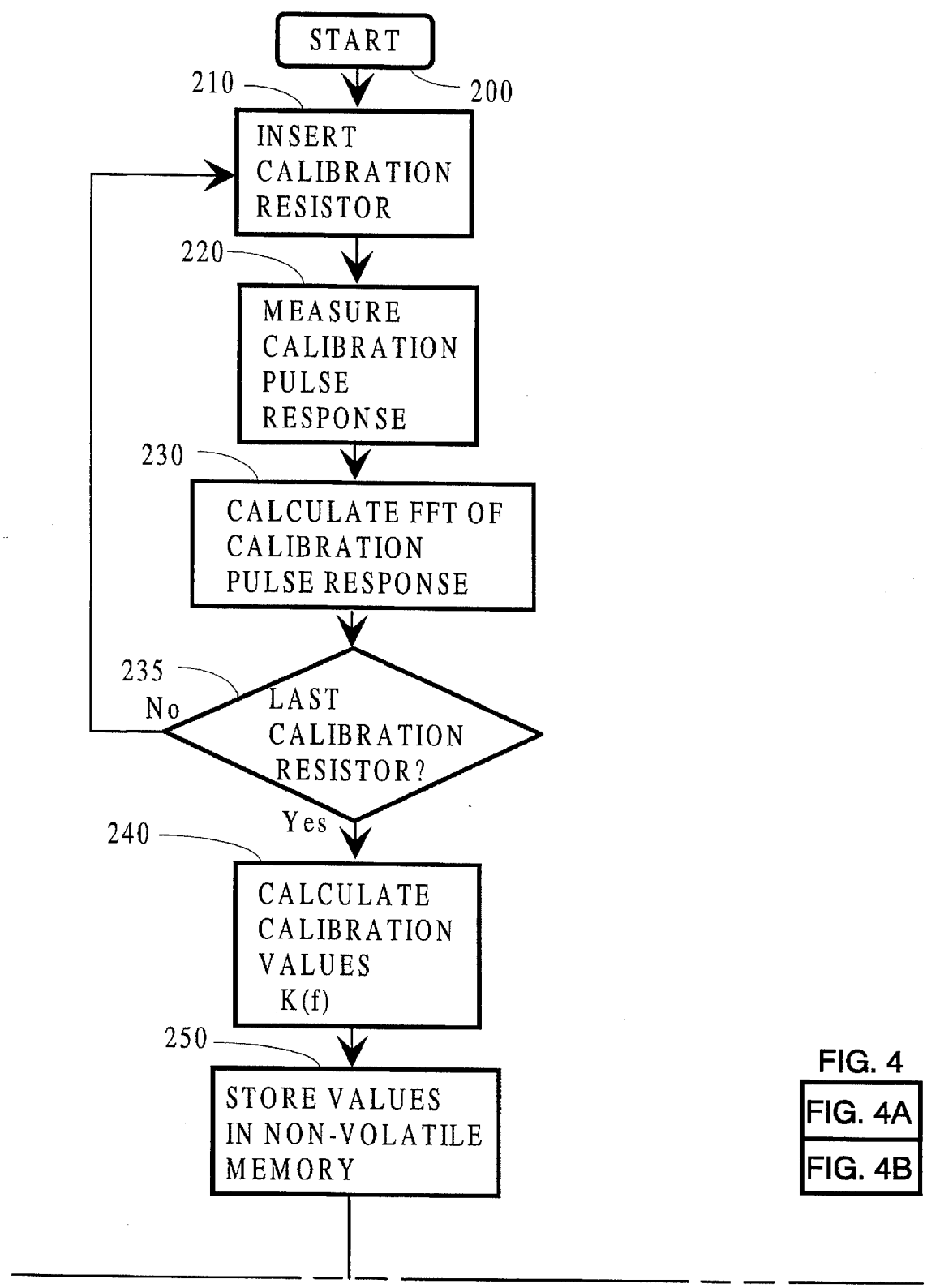
FIGS. 4A–B together comprise a flow diagram of the measurement processes of the impedance measurement instrument.
Figure 4B:
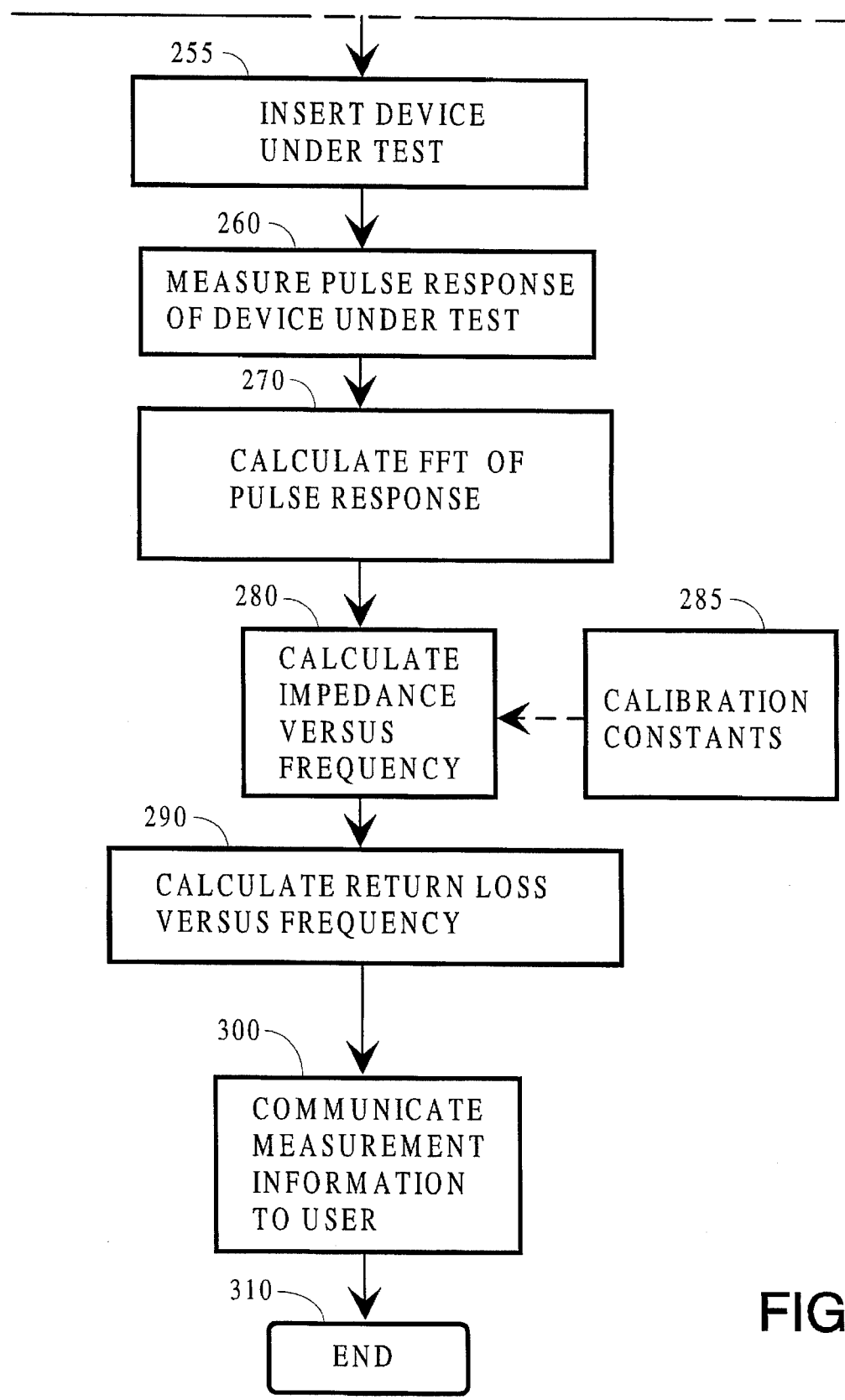

FIGS. 4A–B together comprise a flow diagram of the overall measurement processes of the measurement instrument 10. Process 200 labeled START begins the overall measurement process, which may be initiated automatically upon turning on the instrument 10 or through an operator command via the keypad 70.

Process 210 labeled INSERT CALIBRATION RESISTOR involves coupling a calibration resistor with a known resistance value to the measurement instrument 10. Measuring a set of calibration resistors with different resistance values is required in the preferred embodiment in order to provide a calibrated measurement in which the impedance of the DUT 52 may be extracted. In the preferred embodiment, the calibration of the instrument 10 is implemented as an automated sequence under the control of the microprocessor 62 in which the instrument operator is prompted to insert the appropriate calibration resistor value and the measurement results are automatically stored and processed. Because the calibration resistors form the reference against which the measurement instrument 10 performs the impedance measurements, the absolute accuracy of the set of calibration resistors determines the measurement accuracy of the measurement instrument 10.

In Process 220 labeled MEASURE CALIBRATION PULSE RESPONSE, a calibration pulse response of a calibration resistor is measured.

In Process 230 labeled CALCULATE FFT OF CALIBRATION PULSE RESPONSE, the time record created by Process 220 is transformed into its equivalent calibration frequency domain representation using an FFT and stored in the memory 72.

In Process 235 labeled LAST CALIBRATION RESISTOR?, a decision is reached as to whether the last calibration resistor in the set has been measured. If not, the Processes 210, 220, and 230 are repeated for each calibration resistor remaining in the set.

In Process 240, labeled CALCULATE CALIBRATION VALUES K(f), the calibration values for each of the frequencies f are calculated from the frequency domain representations of the pulse responses of each of the calibration resistors in the set. The calibration values are used to solve for "unknown" values in the pulse generator 52 such as source voltage and impedance using linear equations. It is because the amplitude of the stimulus pulse and the source resistance of the pulse generator are not known precisely and not controlled for over time that it is necessary to measure at least two calibration resistors of two different values which are known and controlled over time. The end result is that when an unknown impedance is coupled to the instrument 10, the impedance can be calculated from the measured response signal and the calibration constants calculated from the measurements of the reference resistors. The calibration constants are complex values where each calibration constant, stored in the memory 72 as an array referenced according to frequency, contains a real and an imaginary component.

The Processes 210, 220, 230, and 240 thus comprise an overall calibration procedure of the measurement instrument 10 that must occur only as necessary. In the preferred embodiment, such calibration constants need only be obtained infrequently, with periods exceeding one year between calibrations. The calibration constants are normally stored in the measurement instrument 10 in the memory 72 on a long term basis.

Referring now to FIG. 4B, in the Process 255 labeled INSERT DEVICE UNDER TEST, the DUT 50 is coupled to the instrument connector 74. In the case of the DUT 50 in the form of the transmission line 12 as shown in FIG. 1, the connector 18 is inserted into the instrument connector 74.

In the Process 260, labeled MEASURE PULSE RESPONSE OF DEVICE UNDER TEST, the pulse response of the DUT 50 is measured and stored as a time record in the acquisition memory 58 in the same manner as measurement of the calibration resistors in the same manner as in the Process 220.

In the Process 270, labeled CALCULATE FFT OF PULSE RESPONSE, the time record created by Process 260 is transformed into its equivalent frequency domain representation and stored in the memory 72 in the same manner as the Process 230.

In the Process 280, labeled CALCULATE IMPEDANCE VERSUS FREQUENCY, the complex impedance versus frequency measured at the terminals of the DUT 50 can be calculated from the frequency domain representation of the pulse response. The calibration constants 285, calculated in Process 240 and stored in Process 250, are an essential part of the calculation of the impedance values.

In the Process 290, labeled CALCULATE RETURN LOSS VERSUS FREQUENCY, a further method of displaying the impedance is presented in terms of return loss. Return loss is a measurement borrowed from traditional network analyzers which commonly display measurement data in this format and many application requirements are still specified in terms of return loss. Return loss is a simple mathematical transform of complex impedance as measured against a known characteristic impedance of the system. In the present invention, the additional step of converting the complex impedance to a return loss measurement involves the application of the following equation:

$$\text{Return Loss} = -20 \log_{10} \left| \frac{Z - Ro}{Z + Ro} \right|$$

where:

Z is the complex impedance; and

Ro is the characteristic impedance of the measurement system.

In the Process 300, labeled COMMUNICATE MEASUREMENT INFORMATION TO USER, the measurement information calculated in the processes 280 and 290 may be graphically or numerically displayed on the display 68 of the measurement instrument 10. Because the impedance contains both real and imaginary data for each frequency in the form of R+jX, a variety of display formats is available to choose from, including, for example, separate graphical plots for the real and imaginary components versus frequency, magnitude and phase versus frequency, magnitude only versus frequency, among others. Alternatively, the data can be plotted on a Smith chart or used to model DUT's in the form of lumped elements such as resistors, capacitors, or inductors, for traditional circuit analysis. The measurement instrument 10 may also provide means for comparing the measurement information to a set of pass/fail limits or other diagnostic techniques to display the information to aid in troubleshooting and diagnosis in field service applications.

In the Process 310, labeled END, the overall measurement processes may end automatically, continue automatically, or be restarted via a user prompt from the keypad 70.

Figure 5A:
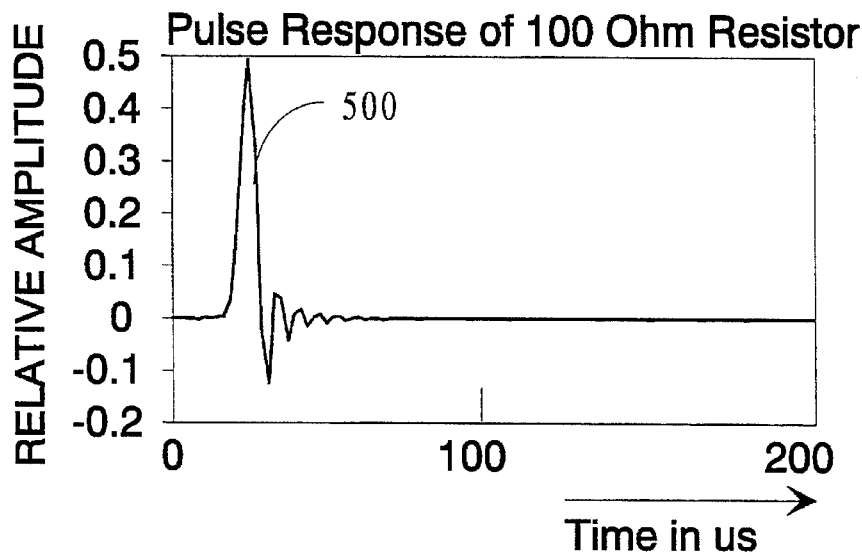
FIGS. 5A–C are graphs that illustrate example pulse responses as contained in the time record of a 100 ohm resistor, an open circuit, and a short circuit present at the instrument terminals of the impedance measurement instrument.
Figure 5B:
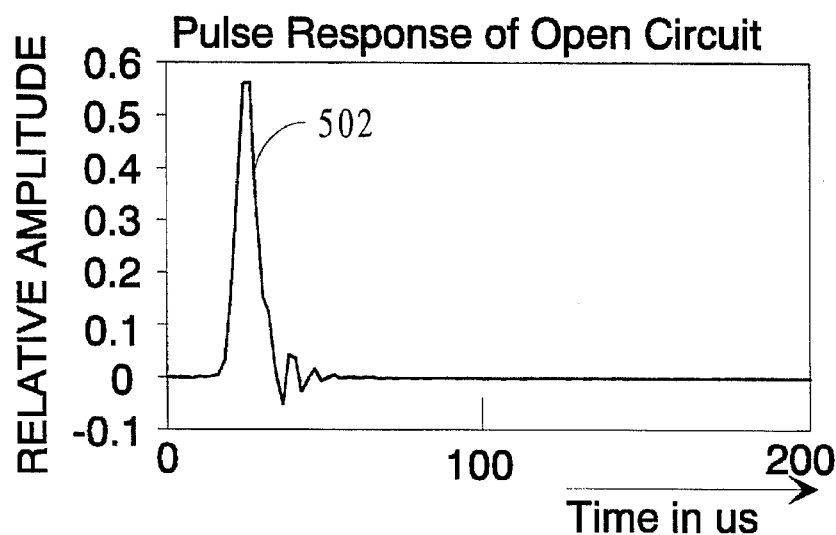
Figure 5C:
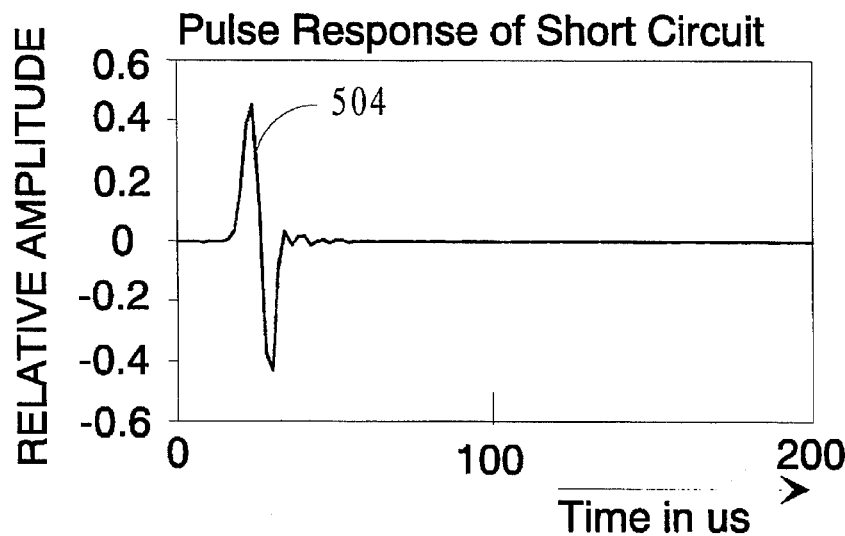

FIGS. 5A–C are graphs that illustrate example pulse responses as stored in the form of time records with a DUT 50 in the form of a 100 ohm resistor, an open circuit, and a short circuit at the instrument connector 74 of the measurement instrument 10. In the preferred embodiment, each time record is 4,096 points in length and with a time resolution of two nanoseconds per point. The vertical scale of each of the three graphs is a relative scale such that the incident pulse amplitude is 0.5.

In FIG. 5A, there is shown a trace 500 corresponding to the pulse response of a 100 ohm resistor coupled to the instrument connector 74. In the preferred embodiment, the characteristic impedance of the instrument 10 at the instrument connector 74 is 100 ohms so the 100 ohm resistor provides a non-reflective termination. The stimulus pulse is shown with a peak amplitude of 0.5. Following the stimulus pulse is a small amount of residual "ringing" due to the presence of reactive components in the instrument 10 but otherwise the stimulus pulse is absorbed by the 100 ohm resistor.

In FIG. 5B, there is shown a trace 502 corresponding to the pulse response of an open circuit at the instrument connector 74. Now, a positive reflected pulse with an amplitude of 0.5 is reflected at the open circuit and returns to combine with the stimulus pulse. Note that the stimulus and reflected pulses do not line up perfectly because the reflected pulse is delayed by approximately 5 nanoseconds as it travels through the balun and instrument connector 74. The combined pulse response appears as a thickened single pulse with an amplitude of 0.56.

In FIG. 5C, there is shown a trace 504 corresponding to the pulse response of a short circuit at the instrument connector 74. Now, a negative reflected pulse with an amplitude of 0.5 is reflected at the short circuit and returns to combine with the stimulus pulse. Note that the stimulus and reflected pulses again do not line up perfectly because the reflected pulse is delayed by approximately 5 nanoseconds as it travels through the balun and instrument connector 74. The combined pulse response appears as a separate positive stimulus pulse and negative response pulse. The pulse responses of the 100 ohm resistor in FIG. 5A and the short circuit of FIG. 5C, along with other pulse responses of calibration resistors of known values, may be employed to calculate the calibration constants used in calculating the impedance of unknown DUT's.

Figure 6A:
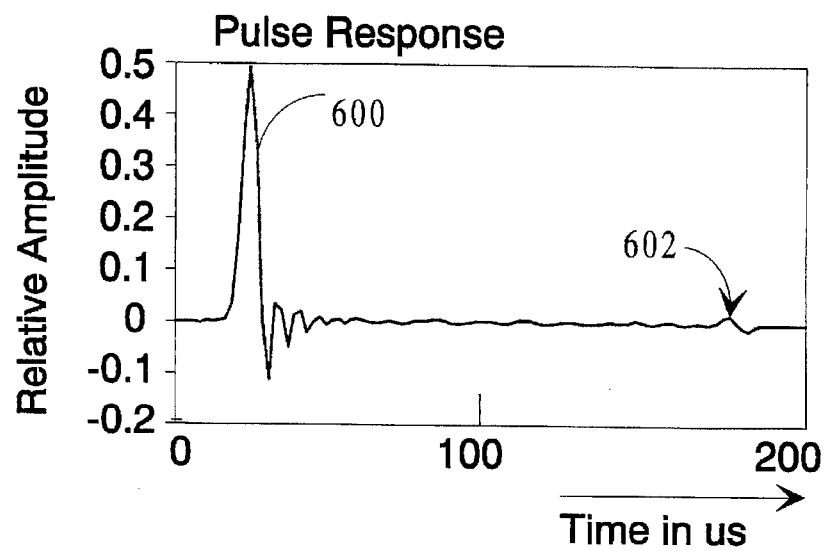
FIGS. 6A–C are graphs that illustrate an example pulse response of a typical transmission line coupled to the impedance measurement instrument, a calculated impedance versus frequency measurement based on the transmission line pulse response, and calculated return loss versus frequency based on the impedance versus frequency measurement in the impedance measurement instrument.
Figure 6B:
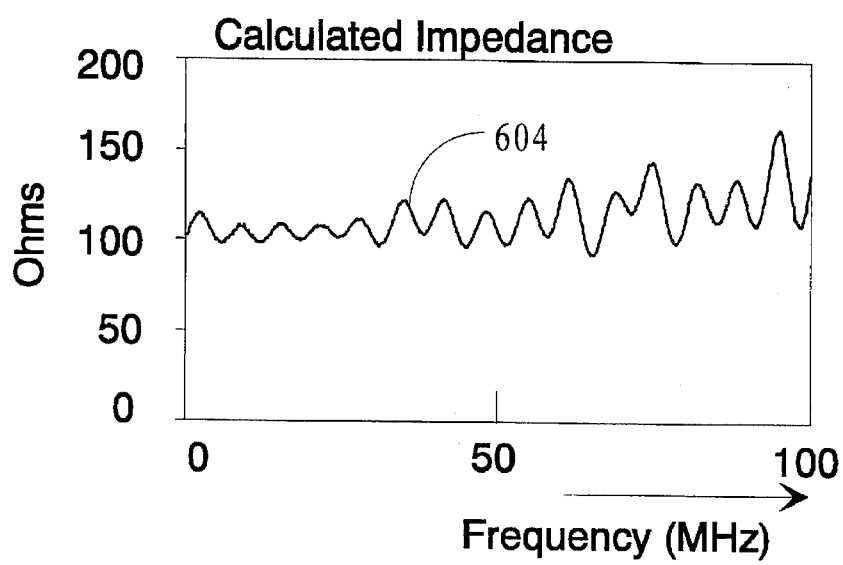
Figure 6C:
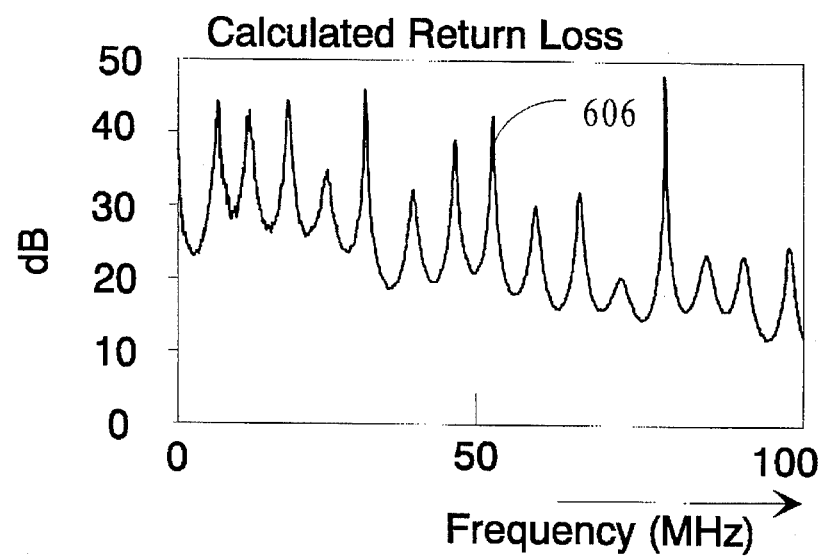

FIGS. 6A–C are graphs that illustrate example results from the overall measurement process when an unknown DUT is coupled to the instrument connector 74. In this example, a DUT 52 in the form of a twisted wire pair transmission line 12 consisting of single segment 16 with a length of 50 feet is coupled to the impedance measurement instrument 10. The pulse response of the transmission line 12 is shown in FIG. 6A, a calculated impedance versus frequency measurement based on the transmission line pulse response and the calibration constants is shown in FIG. 6B, and the calculated return loss versus frequency based on the impedance versus frequency measurement is shown in FIG. 6C.

FIG. 6A is a pulse response measured in a manner identical to the pulse responses of FIGS. 5A–C and with identical vertical and horizontal scales. In FIG. 6A, however, the DUT is no longer a lumped-element component such as a resistor or a short-circuit but is a distributed-element component in the form of a transmission line 12 where propagation time along length of the transmission line is significant. A trace 600 is the measured pulse response. The opposite end of the transmission line 12 is indicated by a small reflected pulse 602 that indicates a discontinuity caused by the connector 18. The transmission line 12 in this example is terminated at the connector 18 with a 100 ohm termination 20 which prevents further reflections from occurring. Including the termination resistor 20 is necessary to obtain an accurate return loss measurement of the transmission line 12 which does not include effects from the connector 18 which is not terminated. The graph of FIG. 6A is thus derived from the processes 250 and 260 of the flow diagram of FIGS. 4A and B.

FIG. 6B is a calculated impedance versus frequency measurement based on the transmission line pulse response and the calibration constants. A trace 604 is the magnitude of the impedance, with the vertical axis in units of ohms and the horizontal axis in units of frequency in megahertz. The impedance of the transmission line is approximately 100 ohms across the frequency range spanning 100 megahertz but is subject to local peaks and valleys which are the result of reflections along the length of the transmission line 12 and from the connectors 14 and 18. Such reflections are the result of discontinuities from the connectors 14 and 18 as was shown in the reflected pulse 602 as well as from reflections due to impedance variations along the length of the transmission line 12. The impedance is thus calculated as explained in the process 280 shown in FIG. 4B.

FIG. 6C is the calculated return loss versus frequency based on the impedance versus frequency measurement data shown in FIG. 6B. A trace 606 represents the values of the calculated return loss. Calculating return loss is done using the mathematical formula discussed in process 290 in FIG. 4B. The vertical axis is in units of decibels (dB) and the horizontal axis in units of frequency in megahertz.

It will be obvious to those having ordinary skill in the art that many changes may be made in the details of the above described preferred embodiments of the invention without departing from the spirit of the invention in its broader aspects. For example, error limits and tolerance bands may be added to the graphical display to aid in field service applications by allowing easy comparison of measurement results with specification limits. Other digital sampling techniques may be employed to build the digital time record, including techniques other than repetitive digital sampling, provided that sufficient speed and resolution are maintained. A single microprocessor may be employed to perform the FFT calculations as well as the instrument control functions to lower the overall parts count and corresponding component cost. Therefore, the scope of the present invention should be determined by the following claims.

What I claim as my invention is:

1. A pulse-based impedance measurement instrument, comprising:
    (a) an instrument connector for coupling to a device under test;
    (b) a pulse generator coupled to said instrument connector for generating stimulus pulses to said device under test;
    (c) a digital sampling circuit coupled to said instrument connector for receiving and sampling a response signal from said device under test to provide digital measurement values;
    (d) an acquisition memory coupled to said sampling circuit for receiving and storing said digital measurement values to form a time record of said response signal;
    (e) a microprocessor coupled to said acquisition memory to receive said time record, wherein said microprocessor:
    performs a fast Fourier transform on said time record to obtain a frequency domain representation, and
    calculates a set of complex impedance values of said device under test using said frequency domain representation and a set of calibration constants derived from measurements of a set of calibration resistors; and
    (f) a display coupled to said microprocessor to visually display said set of complex impedance values.

2. A pulse-based impedance measurement instrument according to claim 1 wherein:
    said stimulus signal is repetitively generated, and
    said time record is acquired by repetitive digital sampling of said response signal.

3. A pulse-based impedance measurement instrument according to claim 1 wherein:
    said microprocessor calculates a set of return loss values from said set of complex impedance values; and
    said display visually displays said set of return loss values.

4. A pulse-based impedance measurement instrument, comprising:
    (a) an instrument connector for coupling to a device under test;
    (b) a pulse generator coupled to said instrument connector for repetitively generating stimulus pulses across said device under test;

(c) a digital sampling circuit coupled to said instrument connector for repetitively sampling a response signal from said device under test at selected time delays from said stimulus pulse and providing digital measurement values;

(d) an acquisition memory coupled to said digital sampling circuit for receiving said digital measurement values, said acquisition memory storing said digital measurement values in memory locations corresponding to said selected time delays to build a time record of said response signal;

(e) a microprocessor coupled to said acquisition memory to receive said time record, wherein said microprocessor:

performs a fast Fourier transform on said time record to obtain a frequency domain representation, and calculates a set of complex impedance values of said device under test using said frequency domain representation and a set of calibration constants derived from measurements of a set of calibration resistors; and (f) a display coupled to said microprocessor to visually display said set of complex impedance values.

5. A pulse-based impedance measurement instrument according to claim 4 wherein:

said microprocessor calculates a set of return loss values from said set of complex impedance values; and said display visually displays said set of return loss values.

6. A pulse-based method of measuring complex impedance, comprising:

(a) measuring a plurality of calibration resistors to obtain calibration time records;

(b) calculating a fast Fourier transform of each of said calibration time records to produce a plurality of calibration frequency domain representations;

(c) calculating a set of calibration constants from said calibration frequency domain representations;

(d) measuring a device under test to produce a time record;

(e) calculating a fast Fourier transform of said time record to produce a frequency domain representation;

(f) calculating a set of complex impedance values from said frequency domain representation and said set of calibration constants; and (g) visually displaying said set of complex impedance values.

7. A pulse-based method of measuring complex impedance according to claim 6 further comprising:

(a) repetitively generating a stimulus pulse to said device under test; and (b) repetitively sampling a response signal from said device under test to obtain said time record.

8. A pulse-based method of measuring complex impedance according to claim 6 further comprising:

calculating a set of return loss values from said set of complex impedance values; and visually displaying said set of return loss values.

* * * * *